(12) United States Patent
Suzuki

(10) Patent No.: US 7,149,667 B2
(45) Date of Patent: Dec. 12, 2006

(54) METHOD AND PROGRAM FOR CALCULATING ION DISTRIBUTION

(75) Inventor: Kunihiro Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 606 days.

(21) Appl. No.: 10/400,619

(22) Filed: Mar. 28, 2003

(65) Prior Publication Data

US 2003/0236646 A1 Dec. 25, 2003

(30) Foreign Application Priority Data

Jun. 19, 2002 (JP) ............................. 2002-178504

(51) Int. Cl.
*G06F 17/10* (2006.01)
(52) U.S. Cl. ........................................... 703/2; 703/13
(58) Field of Classification Search .................... 703/2, 703/12, 13; 702/179; 356/369
See application file for complete search history.

(56) References Cited

U.S. PATENT DOCUMENTS 5,859,784 A * 1/1999 Sawahata ..................... 703/13
2002/0087297 A1 * 7/2002 Kanemura ................... 703/12

OTHER PUBLICATIONS

Ottaviani et al., L. Aluminum Multiple Implantations in 6H-SiC at 300 K, Solid-State Electronics, vol. 43, No. 12, Dec. 1999, pp. 2215-2223.*
Giles et al., M.D. Calculation of Channeling Effects During Ion Implantation Using the Boltzman Transport Equation, IEEE Transactions on Electron Devices, vol. ED-32, No. 10, Oct. 1985, pp. 1918-1924.*
Bobmayr et al., W. Trajectory Split Method for Monte Carlo Simulation of Ion Implantation, IEEE Transactions on Semiconductor Manufacturing, vol. 8, No. 4, Nov. 1995, p. 402-7.*
Hane et al., M. Ion Implantation Model Considering Crystal Structure Effects, IEEE Transactions on Electron Devices, vol. 27, No. 9, Sep. 1990, pp. 1959-1963.*
Gibbons, J.F. Ion Implantation in Semiconductors—Part I Range Distribution Theory and Experiments, proceedings of the IEEE, vol. 56, No. 3, Mar. 1968, pp. 295-319.*
Van Schie et al., E. Two Methods to Improve the Performance of Monte Carlo Simulations of Ion Implantation in Amorphous Targets, IEEE Transactions on Computer-Aided Design, vol. 8, No. 2, Feb. 1989, pp. 108-113.*
Watt et al., J.T. Dispersion of MOS Capacitance-Voltage Characteristics Resulting from the Random Channel Dopant Ion Distribution, IEEE Transactions on Electron Devices, vol. 41, No. 11, Nov. 1994, pp. 2222-2232.*

* cited by examiner

*Primary Examiner*—Russell Frejd
(74) *Attorney, Agent, or Firm*—Staas & Halsey LLP

(57) ABSTRACT

A method and program for calculating ion distribution that reduce an error which will occur in the case of calculating ion distribution created by performing ion implantation on a crystalline member more than one time. An ion distribution specification step specifies existing ion distribution which has been created by performing ion implantation n (n is a natural number) times. An ion distribution assumption step assumes ion distribution which will be created by the (n+1)th ion implantation. A differential calculation step calculates the differential between the ion distribution, which will be created by the (n+1)th ion implantation and which is assumed by the ion distribution assumption step, and the existing ion distribution specified by the ion distribution specification step. An ion distribution calculation step calculates ion distribution created by the (n+1)th ion implantation by calculating the dose of ions implanted by the (n+1)th ion implantation from the differential calculated by the differential calculation step.

9 Claims, 10 Drawing Sheets

METHOD AND PROGRAM FOR CALCULATING ION DISTRIBUTION

CROSS-REFERENCE TO RELATED APPLICATIONS

This application is based on and claims priority of, Japanese Patent Application No. 2002-178504, filed on Jun. 19, 2002, in Japan, the contents being incorporated herein by reference.

BACKGROUND OF THE INVENTION (1) Field of the Invention

This invention relates to a method and program for calculating ion distribution and, more particularly, to a method for calculating ion distribution in a crystalline member in the case of implanting ions in the member more than one time and a program for making a computer perform such a calculation.

(2) Description of the Related Art

Usually arsenic or boronic ions, for example, are implanted in a semiconductor substrate in the process of fabricating a semiconductor device to change the electrical properties of a member.

Ions may be implanted in extension and source or drain areas from four directions in the process of fabricating a metal oxide semiconductor field effect transistor (MOSFET).

FIG. 9 is a view for describing how to perform such ion implantation. As shown in FIG. 9, when ion implantation is performed in the process of fabricating a MOSFET, ions are implanted from four directions, that is to say, from the left-hand and right-hand directions (shown by arrows) and from the front and rear directions (not shown) to form n+ areas.

When such ion implantation is performed, the energy and dose of ions to be implanted must be determined so that desired ion distribution will be obtained. Conventionally, a personal computer or a workstation (hereinafter referred to simply as a computer) therefore has been used to simulate ion distribution.

By the way, the fact that if ions are implanted in a member having crystal structure, crystal structure in an area where the ions collide breaks down into amorphous structure is known.

It would be difficult for ions to go beyond an area where crystal structure has broken down. Accordingly, even if dose is increased, ion concentration in an area beyond an amorphous area will not increase.

FIG. 10 is a view for describing this phenomenon. Horizontal and vertical axes in FIG. 10 indicate the depth from the surface of a member where ions are implanted and the concentration of ions implanted, respectively. Each curve indicates results obtained when dose is changed.

As shown in FIG. 10, an increase in concentration at the peak portions (each corresponding to an amorphous area) of graphs is almost proportional to an increase in dose. On the other hand, concentration in an area (channeling area) beyond the amorphous area is almost constant regardless of an increase in dose.

Conventionally, to simulate a case where ion implantation is performed more than one time, a result obtained by performing ion implantation once has simply been added accumulatively by the number of times ion implantation is performed.

As stated above, the concentration of ions in an amorphous area shows linearity. Therefore, the principle of superposition applies and an obtained result approximates to the correct value.

However, the concentration of ions in a channeling area does not show linearity. Therefore, the principle of superposition does not apply and a result obtained by simply adding differs significantly from the correct value.

SUMMARY OF THE INVENTION

The present invention was made under the background circumstances as described above. An object of the present invention is to provide a method for calculating ion distribution which can obtain a simulation result approximate to the correct value even in the case of implanting ions in a member having crystal structure more than one time and a program for executing such a method for calculating ion distribution.

In order to achieve the above object, a method for calculating ion distribution in a crystalline member in the case of implanting ions in the member more than one time is provided. This method for calculating ion distribution comprises an ion distribution specification step for specifying existing ion distribution which has been created by performing ion implantation n (n is a natural number) times, an ion distribution assumption step for assuming ion distribution which will be created by performing the (n+1)th ion implantation, a differential calculation step for calculating the differential between the ion distribution, which will be created by the (n+1)th ion implantation and which is assumed by the ion distribution assumption step, and the existing ion distribution specified by the ion distribution specification step, and an ion distribution calculation step for calculating ion distribution created by the (n+1)th ion implantation by calculating the dose of ions implanted by the (n+1)th ion implantation from the differential calculated by the differential calculation step.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENT

An embodiment of the present invention will now be described with reference to the drawings.

Figure 1:
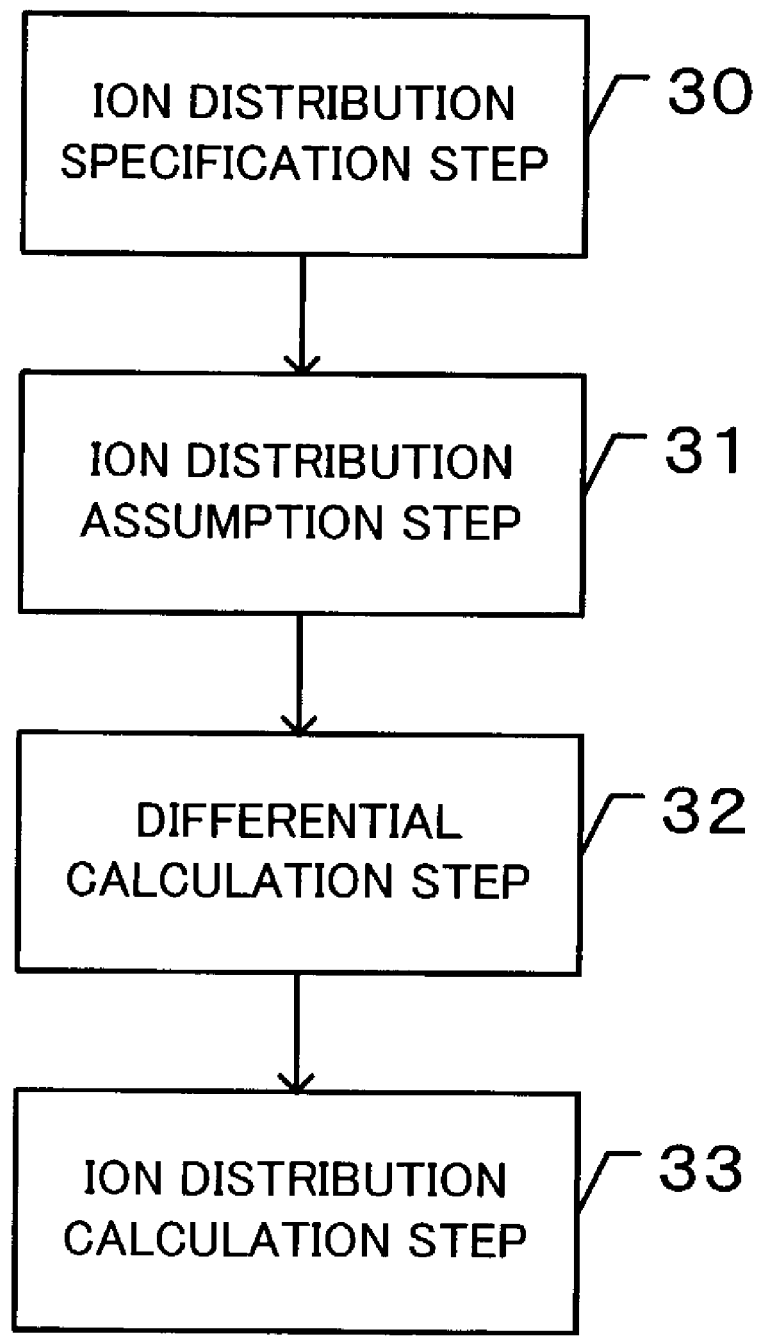
FIG. 1 is a view for describing the principles underlying operation according to the present invention.

FIG. 1 is a view for describing the principles underlying operation according to the present invention. As shown in FIG. 1, a method for calculating ion distribution according to the present invention comprises an ion distribution specification step 30, an ion distribution assumption step 31, a differential calculation step 32, and an ion distribution calculation step 33.

The ion distribution specification step 30 specifies existing ion distribution which has been created by performing ion implantation n (n is a natural number) times.

The ion distribution assumption step 31 assumes ion distribution which will be created by the (n+1)th ion implantation.

The differential calculation step 32 calculates the differential between the ion distribution, which will be created by the (n+1)th ion implantation and which is assumed by the ion distribution assumption step 31, and the existing ion distribution specified by the ion distribution specification step 30.

The ion distribution calculation step 33 calculates the distribution of ions implanted by the (n+1)th ion implantation by calculating dose at the time of the (n+1)th ion implantation from the differential calculated by the differential calculation step 32.

Now, operation performed in FIG. 1 will be described. A description will be given with a case where ion implantation is to be performed a total of five times and where ion distribution created by the third ion implantation is calculated as an example.

First, the ion distribution specification step 30 specifies the state of ion distribution which has been formed by the last ion implantation, that is to say, by the second ion implantation and supplies specified information to the ion distribution assumption step 31.

The ion distribution assumption step 31 assumes ion distribution which will be created by the next ion implantation, that is to say, by the third ion implantation and supplies it to the differential calculation step 32.

The differential calculation step 32 calculates the differential between the ion distribution, which will be created by the third ion implantation and which is assumed by the ion distribution assumption step 31, and the ion distribution, which has been formed by the second ion implantation and which is specified by the ion distribution specification step 30, and supplies a result obtained to the ion distribution calculation step 33.

The ion distribution calculation step 33 calculates dose from the differential supplied from differential calculation step 32 and calculates ion distribution obtained by ion implantation. Then the ion distribution calculation step 33 outputs a result obtained as the result of calculating ion distribution obtained by the third ion implantation.

As described above, with the method for calculating ion distribution according to the present invention, the dose of implanted ions is calculated on the basis of the differential between the existing ion distribution and ion distribution which will be created by the next ion implantation, and ion distribution obtained by the next ion implantation is calculated on the basis of dose obtained. Therefore, ion distribution in a channeling area can be simulated accurately, compared with the conventional method in which a result obtained by performing ion implantation once is increased by more than one time.

Now, an embodiment of the present invention will be described.

Figure 2:
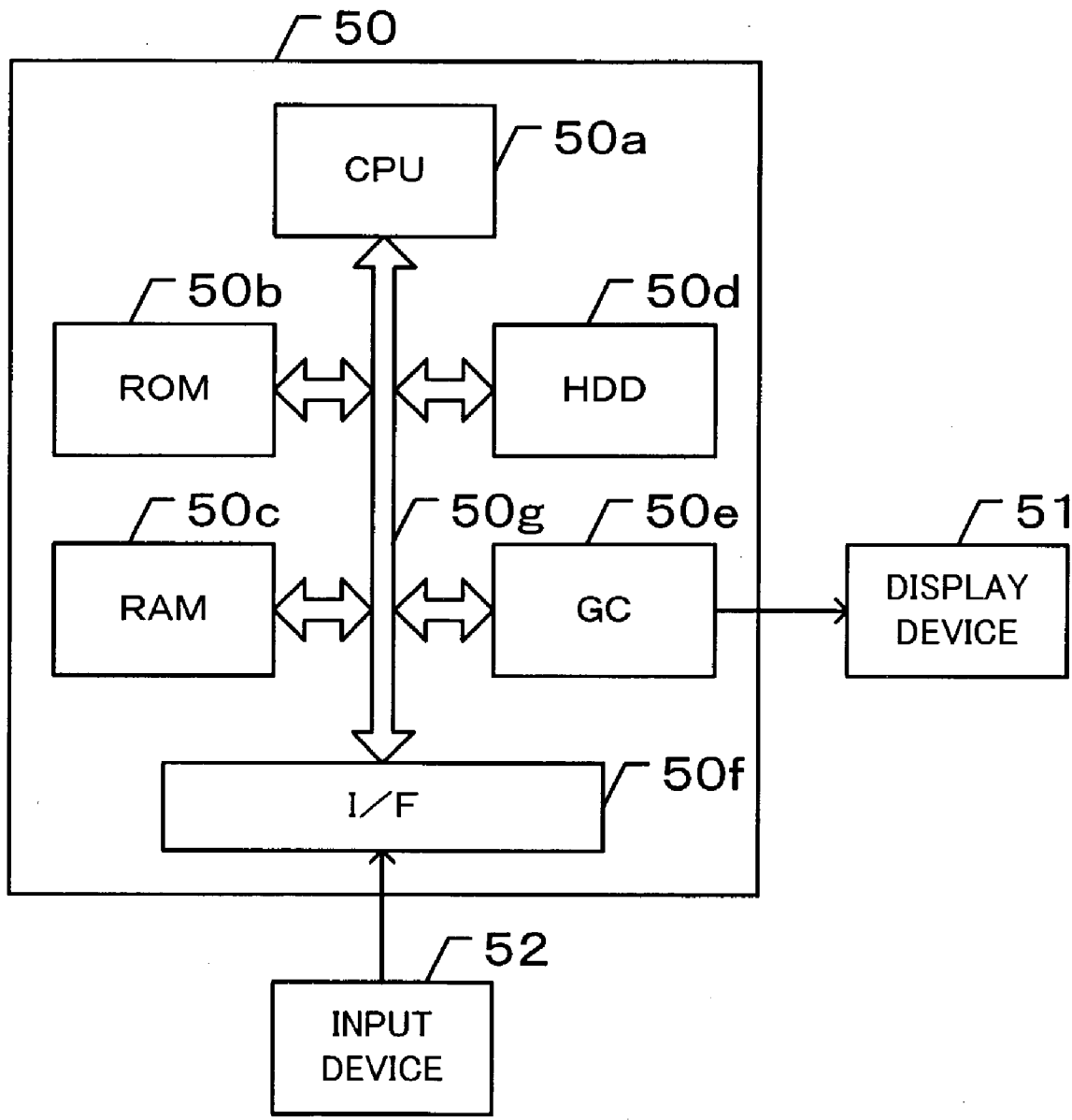
FIG. 2 is a view showing the structure of an embodiment of the present invention.

FIG. 2 is a view showing the structure of an embodiment of the present invention. As shown in FIG. 2, a computer 50 which executes the method for calculating ion distribution according to the present invention comprises a central processing unit (CPU) 50a, a read only memory (ROM) 50b, a random access memory (RAM) 50c, a hard disk drive (HDD) 50d, a graphics card (GC) 50e, an interface (I/F) 50f, and a bus 50g. Moreover, a display device 51 and input device 52 are connected to the outside of the computer 50.

The CPU 50a performs various operation processes in compliance with programs stored in the HDD 50d and controls each section of the computer 50.

The ROM 50b holds basic programs executed by the CPU 50a and data.

The RAM 50c temporarily stores a program which is being executed by the CPU 50a and data which is being processed by the CPU 50a.

The HDD 50d stores programs executed by the CPU 50a and data which is processed by the CPU 50a. The HDD 50d also stores data generated as a result of operation processes by the CPU 50a.

The GC 50e performs a drawing process on the basis of drawing data supplied from the CPU 50a, converts an obtained image into video signals, and outputs them to the display device 51.

The I/F 50f converts the representation format of data output from the input device 52 into the internal representation format and outputs it.

The bus 50g connects the CPU 50a, ROM 50b, RAM 50c, HDD 50d, GC 50e, and I/F 50f to one another so that they can exchange data with one another.

The display device 51 includes a liquid crystal display (LCD), a cathode ray tube (CRT) display, or the like and outputs video signals output from the GC 50e.

The input device 52 includes a mouse, a keyboard, or the like. The input device 52 generates data in response to operation by a user and outputs it.

Now, operation performed in the above embodiment will be described.

A method for calculating ion distribution will be described first, then operation performed in the embodiment shown in FIG. 2 will be described.

Figure 3:
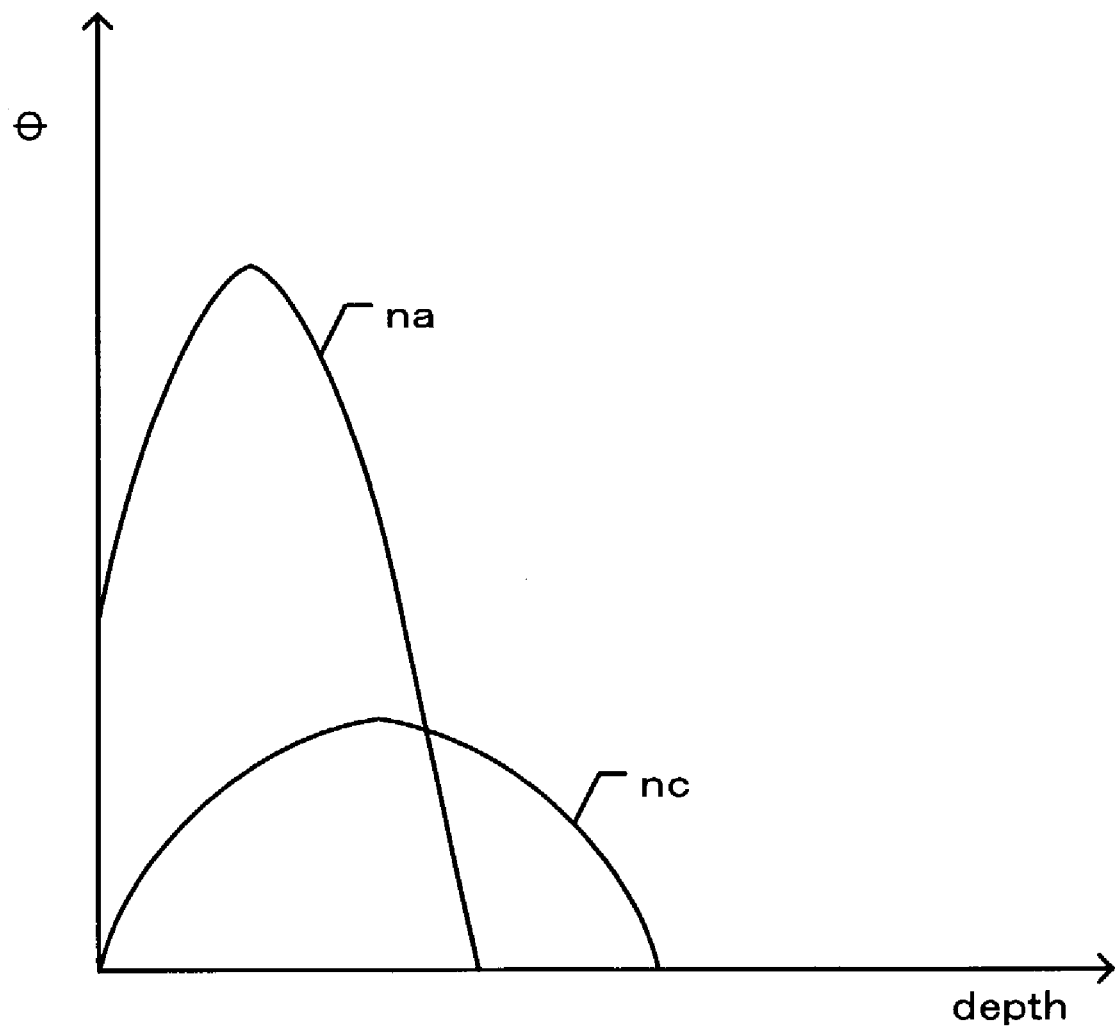
FIG. 3 is a view for describing the principles underlying a method for calculating ion distribution according to the present invention.

Concentration distribution N(x) created in the case of performing ion implantation on a semiconductor substrate with a dose of Φ is given by $$N(x) = \Phi[rn_a(x) + (1-r)n_c(x)] \qquad (1)$$

where x is the distance (depth) from the surface of the semiconductor substrate, r is a dose ratio, $n_a$ is concentration in an amorphous area, and $n_c$ is concentration in a channeling area. In other words, as shown in FIG. 3, with the method for calculating ion distribution according to the present invention, ion distribution $n_a$ in an amorphous area and ion distribution $n_c$ in a channeling area are calculated separately and the entire ion distribution is obtained by adding obtained results together.

Formula (1) can equivalently be expressed as $$N(x) = (\Phi - \Phi_{chan})n_a(x) + \Phi_{chan}n_c(x) \quad (2)$$

where $\Phi_{chan}$ is the dose of ions implanted in the channeling area. r and $\Phi_{chan}$ depend on the dose $\Phi$, so these can be expressed as r ($\Phi$) and $\Phi_{chan}$ respectively. Then the following relation will exist between them.

$$\Phi_{chan} = (1-r)\Phi \quad (3)$$

It is assumed that the entire dose $\Phi$ is equally divided into nths and that ion implantation is performed n times.

In this case, the dose of ions implanted each time is $\Phi/n$. By substituting $\Phi/n$ for $\Phi$ in formula (2), ion distribution created each time ion implantation is performed is given by:

$$N_1(x) = \left(\frac{\Phi}{n} - \Phi_{chan}\left(\frac{\Phi}{n}\right)\right)n_a(x) + \Phi_{chan}\left(\frac{\Phi}{n}\right)n_c(x) \quad (4)$$

$$N_2(x) = \left(2\frac{\Phi}{n} - \Phi_{chan}\left(2\frac{\Phi}{n}\right)\right)n_a(x) + \Phi_{chan}\left(2\frac{\Phi}{n}\right)n_c(x)$$

$$\vdots$$

$$N_i(x) = \left(i\frac{\Phi}{n} - \Phi_{chan}\left(i\frac{\Phi}{n}\right)\right)n_a(x) + \Phi_{chan}\left(i\frac{\Phi}{n}\right)n_c(x)$$

$$N_{i+1}(x) = \left((i+1)\frac{\Phi}{n} - \Phi_{chan}\left((i+1)\frac{\Phi}{n}\right)\right)n_a(x) + \Phi_{chan}\left((i+1)\frac{\Phi}{n}\right)n_c(x)$$

$$\vdots$$

$$N_n(x) = \left(n\frac{\Phi}{n} - \Phi_{chan}\left(n\frac{\Phi}{n}\right)\right)n_a(x) + \Phi_{chan}\left(n\frac{\Phi}{n}\right)n_c(x) =$$

$$(\Phi - \Phi_{chan}(\Phi))n_a(x) + \Phi_{chan}(\Phi)n_c(x)$$

By the way, with the conventional method a calculation result has been obtained in the following way. If ion implantation is repeated n times with a dose of $\Phi/n$, ion distribution created by performing ion implantation with a dose of $\Phi/n$ is calculated and obtained ion distribution is simply increased by n times. That is to say, with the conventional method ion distribution created by performing ion implantation n times has been obtained by the use of the following formulas.

$$N_1(x) = \left(\frac{\Phi}{n} - \Phi_{chan}\left(\frac{\Phi}{n}\right)\right)n_a(x) + \Phi_{chan}\left(\frac{\Phi}{n}\right)n_c(x) \quad (5)$$

$$N_2(x) = 2\left(\frac{\Phi}{n} - \Phi_{chan}\left(\frac{\Phi}{n}\right)\right)n_a(x) + 2\Phi_{chan}\left(\frac{\Phi}{n}\right)n_c(x)$$

$$\vdots$$

$$N_i(x) = i\left(\frac{\Phi}{n} - \Phi_{chan}\left(\frac{\Phi}{n}\right)\right)n_a(x) + i\Phi_{chan}\left(\frac{\Phi}{n}\right)n_c(x)$$

$$N_{i+1}(x) = (i+1)\left(\frac{\Phi}{n} - \Phi_{chan}\left(\frac{\Phi}{n}\right)\right)n_a(x) + (i+1)\Phi_{chan}\left(\frac{\Phi}{n}\right)n_c(x)$$

$$\vdots$$

$$N(x) = n\left(\frac{\Phi}{n} - \Phi_{chan}\left(\frac{\Phi}{n}\right)\right)n_a(x) + n\Phi_{chan}\left(\frac{\Phi}{n}\right)n_c(x) = nN_1(x)$$

With such a method, however, $n_c$ shown in FIG. 3 is simply increased by n times. An accurate simulation result therefore cannot be obtained.

Figure 4:
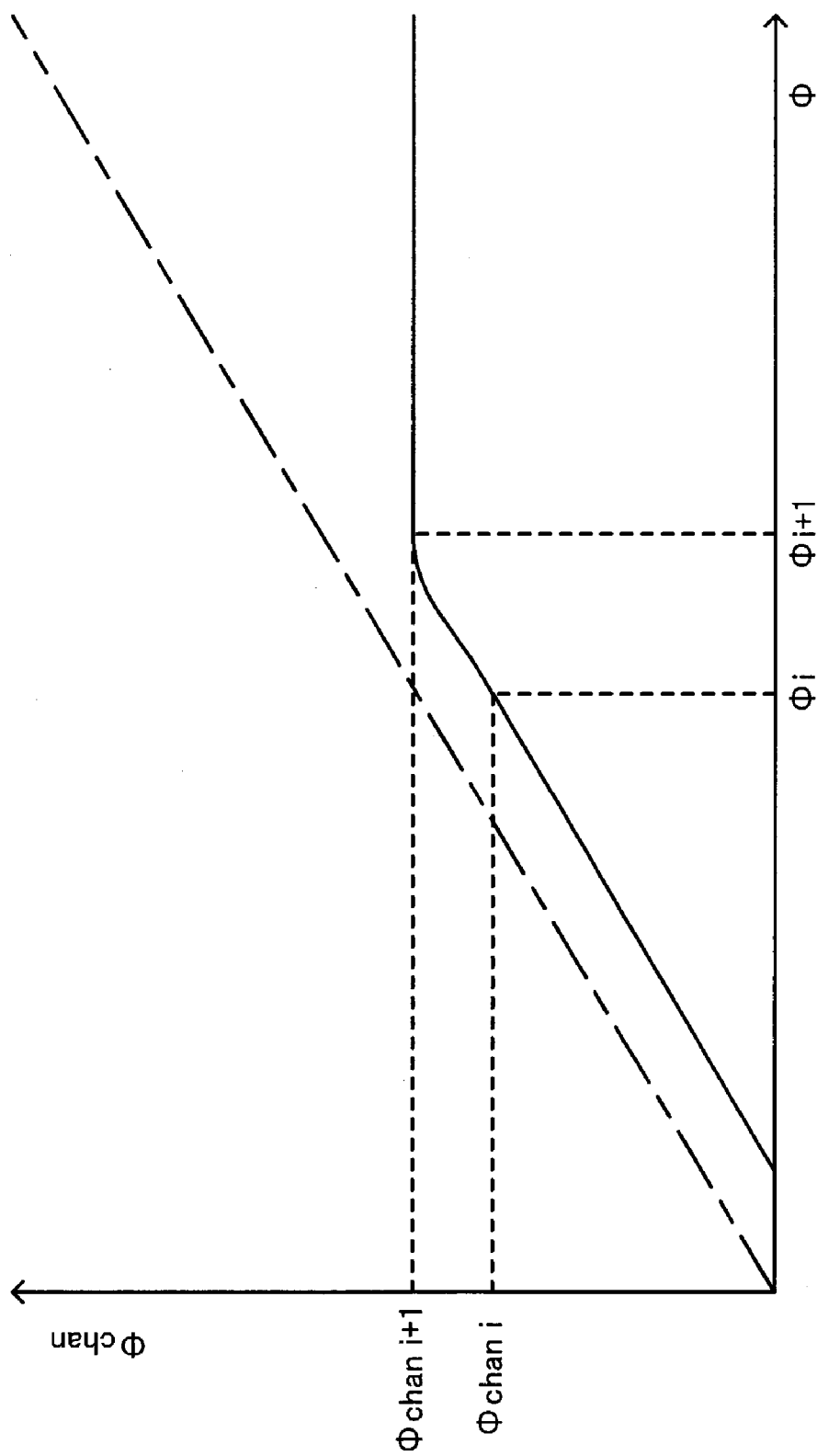
FIG. 4 is a view showing a relation between dose and a channel dose.

As shown in FIG. 4, in the embodiment of the present invention, the relation between the dose $\Phi$ and the dose $\Phi_{chan}$ in the channeling area is calculated first. To calculate ion distribution created by the (i+1)th ion implantation, the differential between ion distribution created by the ith ion implantation and the ion distribution created by the (i+1)th ion implantation is calculated and the ion distribution created by the (i+1)th ion implantation is calculated with an obtained differential considered as the dose of ions implanted in the channeling area.

That is to say, the distribution of ion concentration $\Delta N_i(x)$ newly added by the (i+1)th ion implantation is given by $$\Delta N_i(x) = N_{i+1}(x) - N_i(x) \quad (6)$$

$$= \left[\frac{\Phi}{n} - \left[\Phi_{chan}\left((i+1)\frac{\Phi}{n}\right) - \Phi_{chan}\left(i\frac{\Phi}{n}\right)\right]\right]n_a(x) +$$

$$\left[\Phi_{chan}\left((i+1)\frac{\Phi}{n}\right) - \Phi_{chan}\left(i\frac{\Phi}{n}\right)\right]n_c(x)$$

Therefore, the (i+1)th ion implantation is performed with a dose of $\Phi/n$. Moreover, the dose of ions implanted in the channeling area can be considered to be given by $$\Phi_{chan}\left((i+1)\frac{\Phi}{n}\right) - \Phi_{chan}\left(i\frac{\Phi}{n}\right) \quad (7)$$

Ion distribution which changes each time ion implantation is performed can be calculated in this way.

Figure 5:
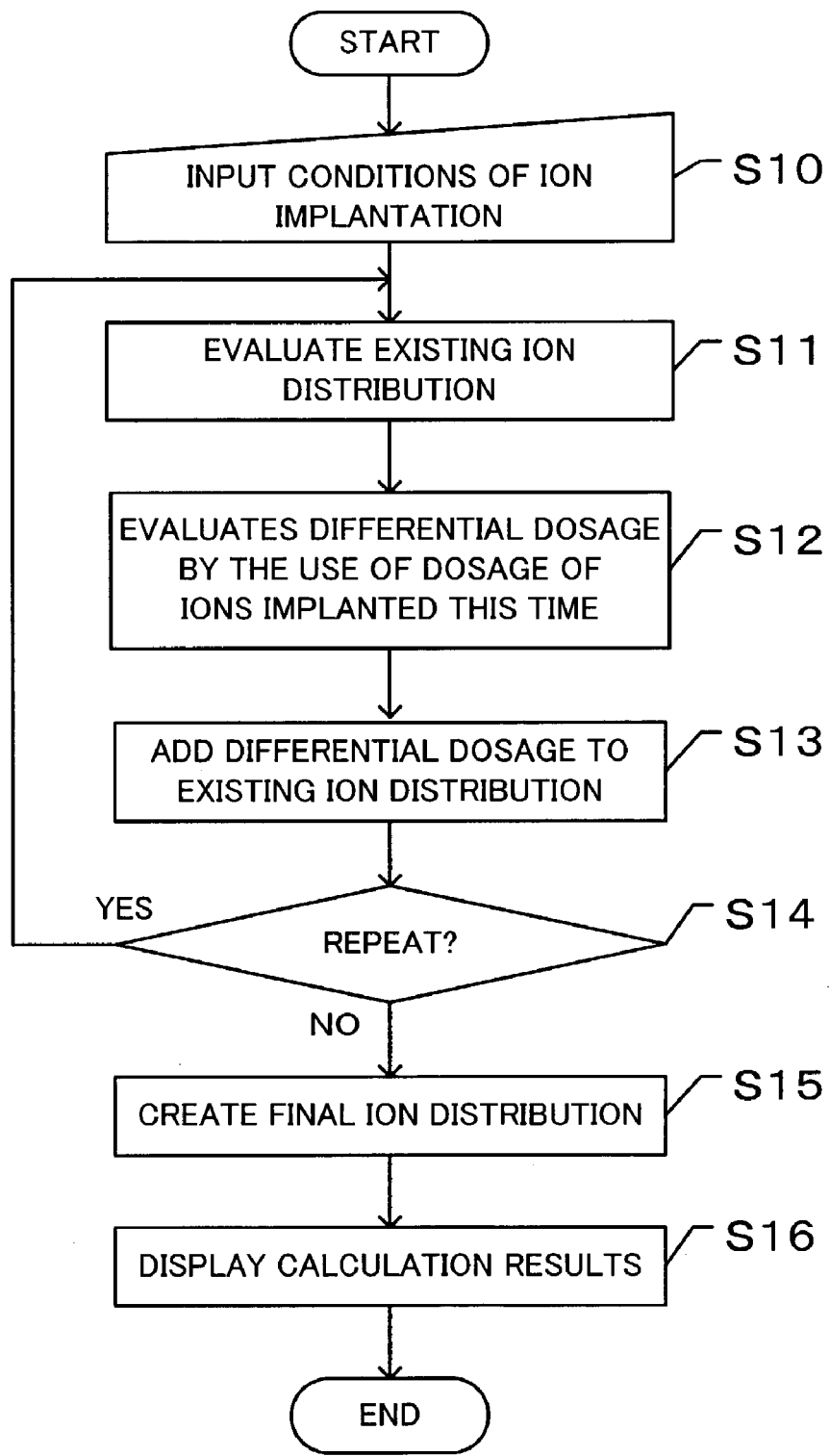
FIG. 5 is a flow chart for describing the flow of a process performed in the method for calculating ion distribution according to the present invention.

Now, the operation performed in the above embodiment will be described concretely. FIG. 5 is a flow chart for describing the operation performed in the embodiment shown in FIG. 2. The following steps will be performed in compliance with this flow chart.

[Step S10] The CPU 50a inputs the conditions of ion implantation via the input device 52. The conditions of ion implantation include the dose $\Phi$ of all ions, the dose ratio r, and data indicative of the relation between the dose $\Phi$ and the dose $\Phi_{chan}$ in the channeling area shown in FIG. 4.

[Step S11] The CPU 50a evaluates the dose of ions in the existing ion distribution. That is to say, the CPU 50a calculates Ni(x) included in formulas (4).

[Step S12] The CPU 50a evaluates a differential dose by the use of the dose of ions implanted this time. That is to say, the CPU 50a calculates the differential dose $\Delta N_i(x)$ with formula (6).

[Step S13] The CPU 50a calculates ion distribution created by the (i+1)th ion implantation by adding the differential dose calculated in step S12 to the existing ion distribution calculated in step S11.

[Step S14] If an ion implantation process is repeated, then the CPU 50a returns to step S11 to repeat the same process as described above. If an ion implantation process is not repeated, then the CPU 50a proceeds to step S15.

[Step S15] The CPU 50a creates final ion distribution, generates drawing instructions corresponding to it, and supplies them to the GC 50e.

[Step S16] The GC 50e makes the display device 51 display the calculation results supplied from the CPU 50a in step S15.

By performing the above process, ion distribution can be calculated accurately and an error will not occur in a channeling area.

The flow of a process performed in a conventional method for calculating ion distribution will also be described for comparison.

Figure 6:
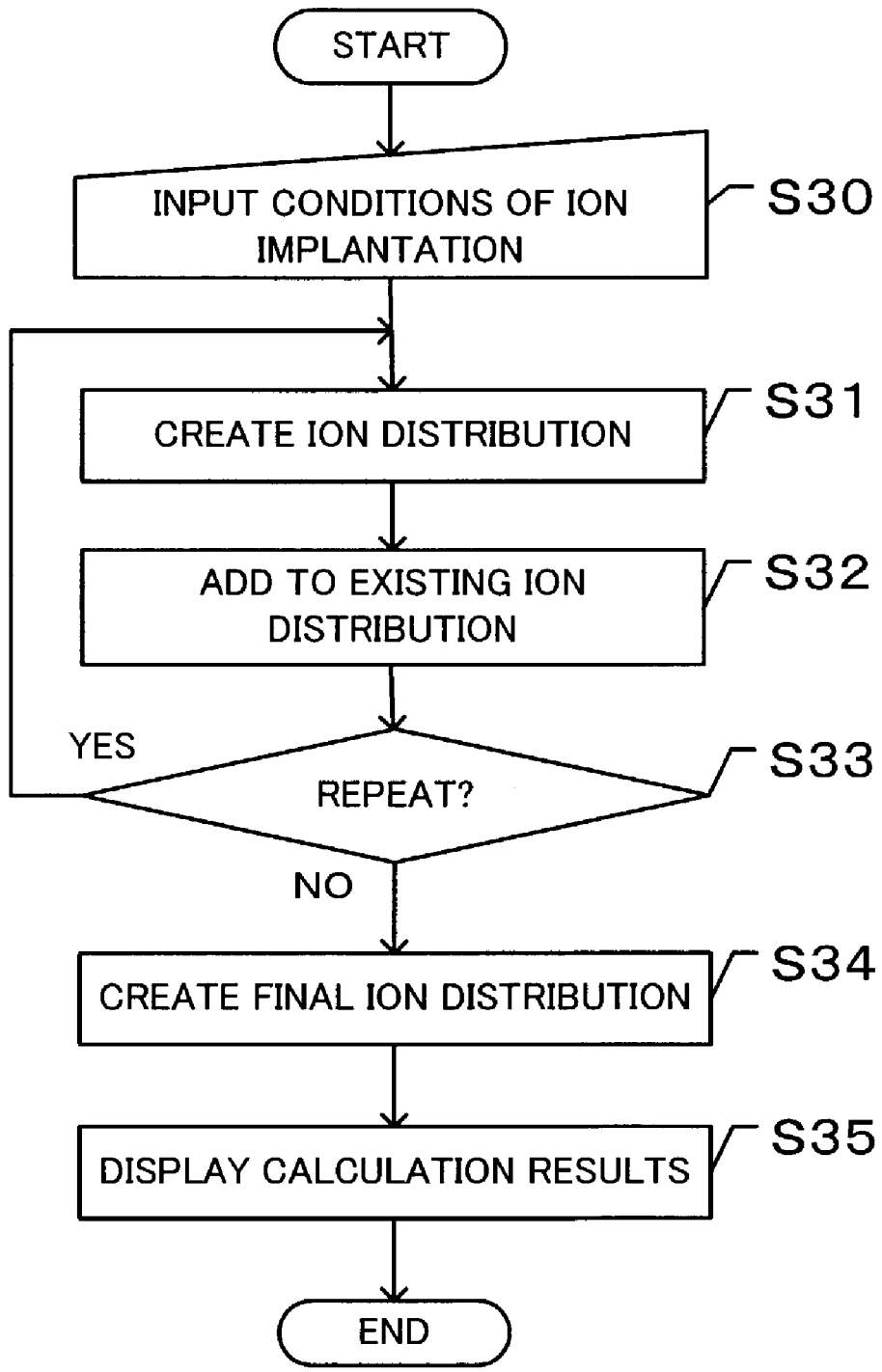
FIG. 6 is a flow chart for describing the flow of a process performed in a conventional method for calculating ion distribution.

FIG. 6 is a flow chart for describing the flow of a process performed in a conventional method for calculating ion distribution. The following steps will be performed in compliance with this flow chart.

[Step S30] The CPU 50a inputs the conditions of ion implantation via the input device 52.

[Step S31] The CPU 50a creates ion distribution. That is to say, the CPU 50a calculates ion distribution created by ion implantation indicated by one of formulas (5).

[Step S32] The CPU 50a adds the ion distribution obtained in step S31 to the existing ion distribution.

[Step S33] If an ion implantation process is repeated, then the CPU 50a returns to step S31 to repeat the same process as described above. If an ion implantation process is not repeated, then the CPU 50a proceeds to step S34.

[Step S34] The CPU 50a creates final ion distribution.

[Step S35] The CPU 50a supplies drawing instructions corresponding to the calculation results to the GC 50e. As a result, the calculation results are displayed on the screen of the display device 51.

Figure 7:
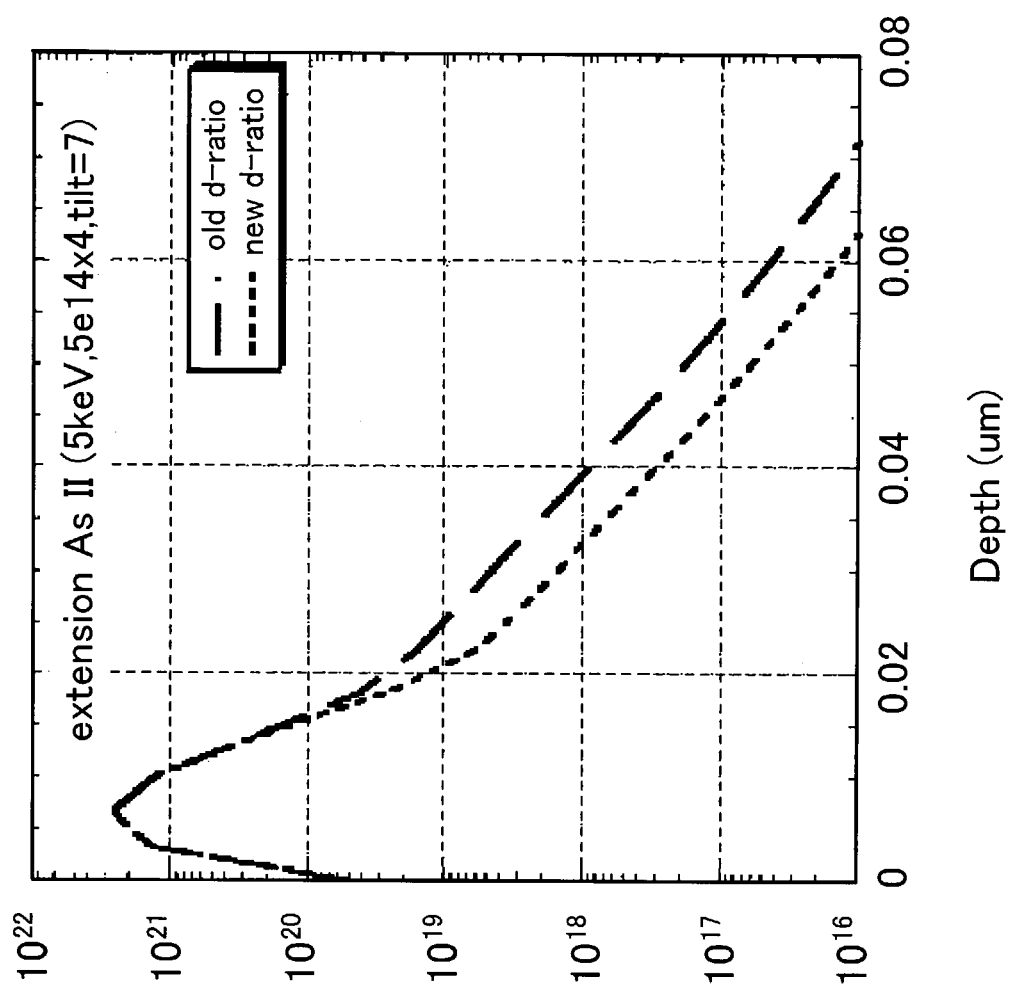
FIG. 7 is a view showing ion distribution obtained by the method for calculating ion distribution according to the present invention and the conventional method for calculating ion distribution.

FIG. 7 are graphs showing the distribution of ion concentration obtained by the method for calculating ion distribution according to the present invention and the conventional method for calculating ion distribution. Horizontal and vertical axes in FIG. 7 indicate the depth from the surface of a semiconductor substrate and ion concentration, respectively. A dashed line (old d-ratio) and dotted line (new d-ratio) are graphs obtained by the use of the conventional method for calculating ion distribution and the method for calculating ion distribution according to the present invention, respectively.

As is shown by these graphs, values in an area (channeling area) at a great depth from the surface of the semiconductor substrate which are obtained by the use of the conventional method for calculating ion distribution are greater than those obtained by the use of the method for calculating ion distribution according to the present invention. As stated above, this is caused by an error in the channeling area.

Figure 8:
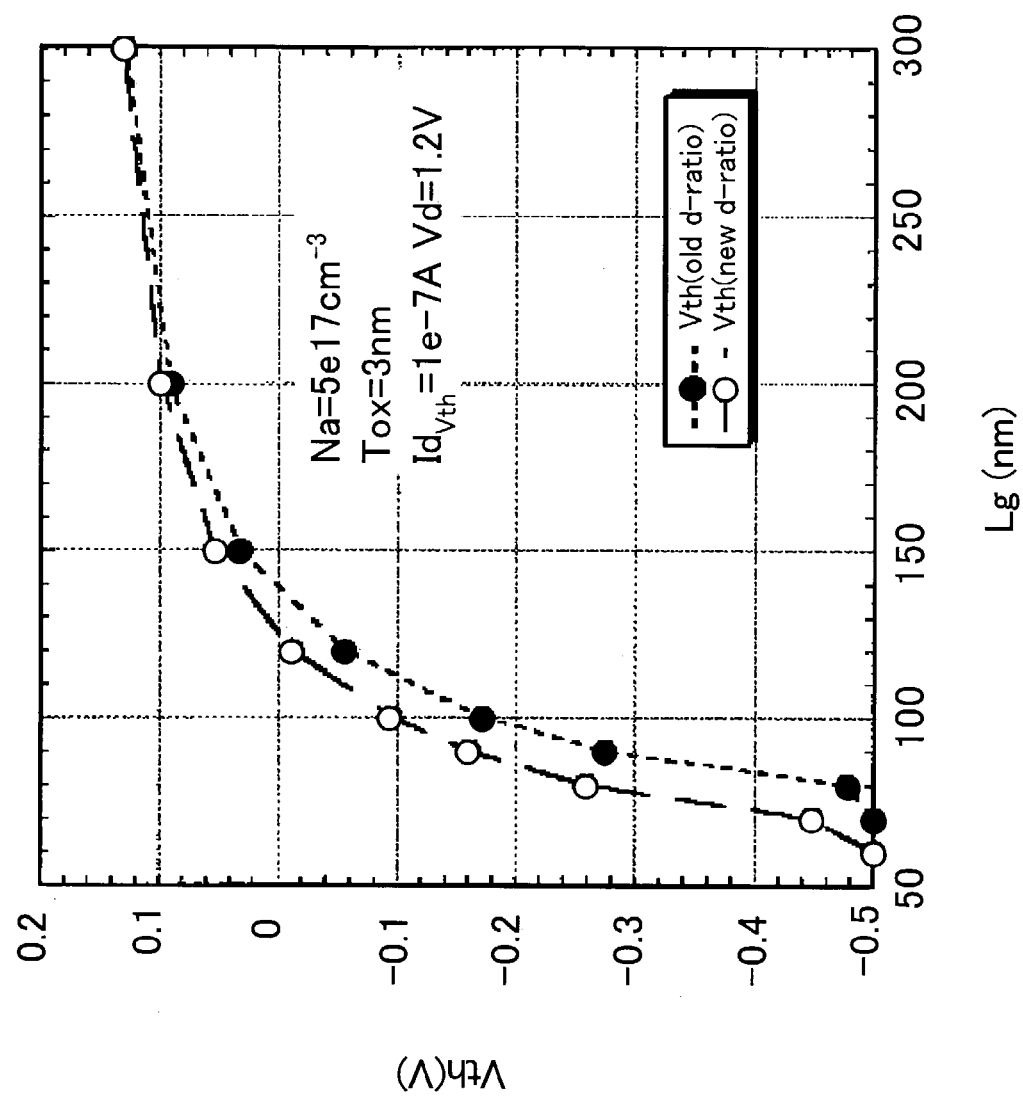
FIG. 8 is a view showing relations between the length of a gate and a threshold obtained by the method for calculating ion distribution according to the present invention and the conventional method for calculating ion distribution.
Figure 9:
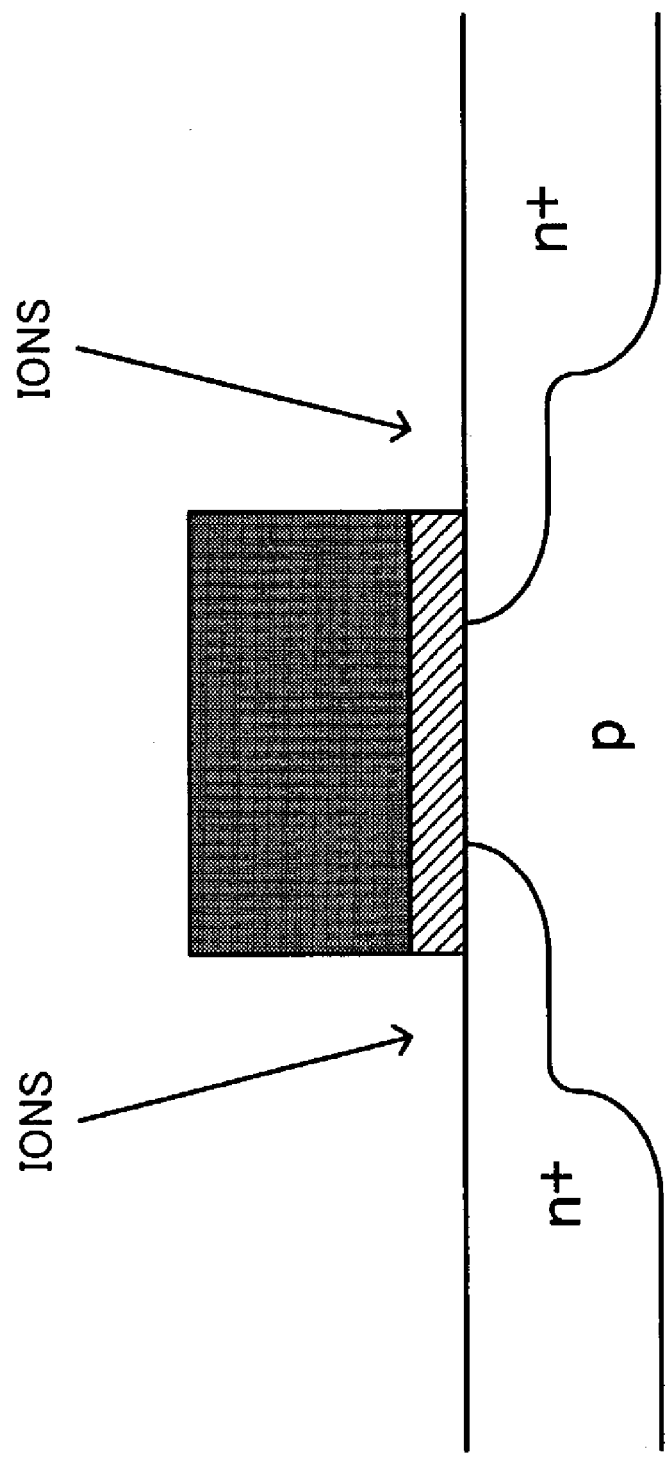
FIG. 9 is a view showing how to perform ion implantation.
Figure 10:
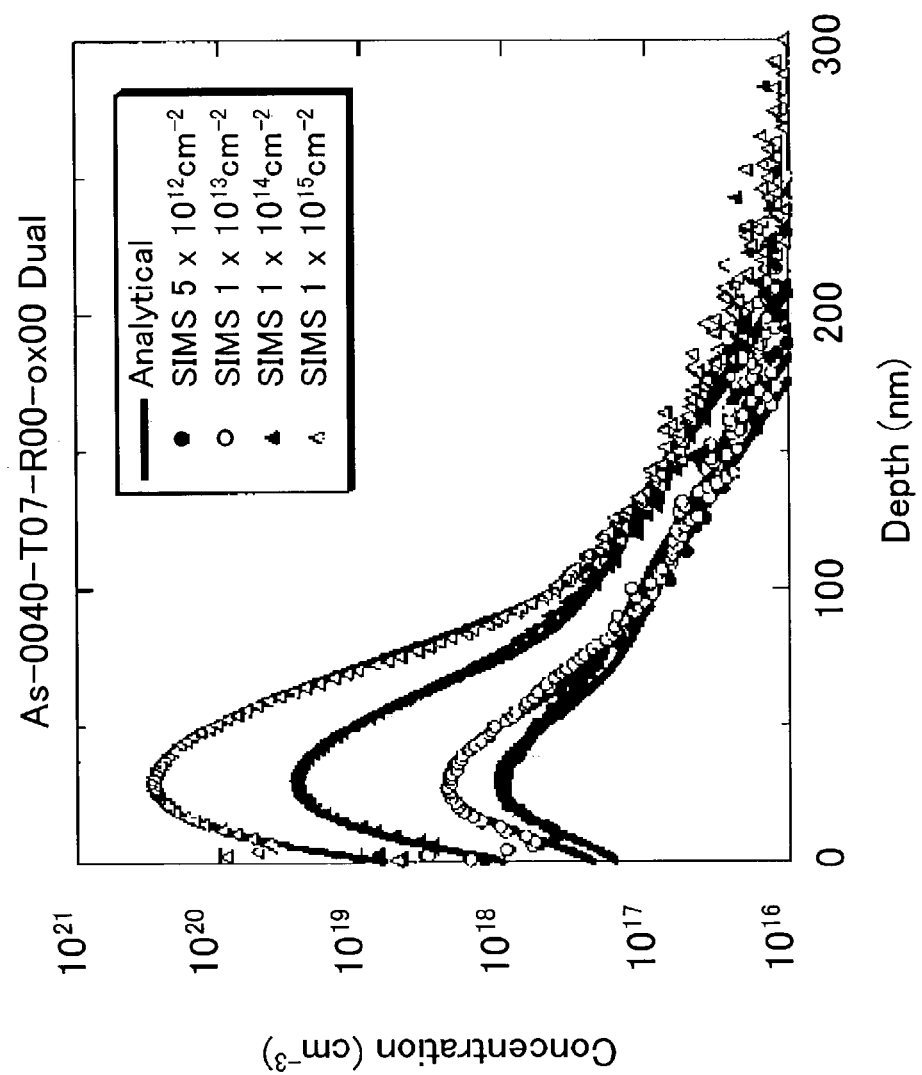
FIG. 10 is a view showing relations between ion distribution and dose.

FIG. 8 are graphs showing relations between the length of the gate of a transistor and a threshold simulated on the basis of ion distribution obtained by the method for calculating ion distribution according to the present invention and the conventional method for calculating ion distribution.

Horizontal and vertical axes in FIG. 8 indicate the length of the gate of a transistor and the threshold of the transistor, respectively. A dotted line (old d-ratio) and dashed line (new d-ratio) are graphs obtained by the use of the conventional method for calculating ion distribution and the method for calculating ion distribution according to the present invention, respectively.

These graphs show that as gate length grows shorter, the difference between values obtained by the use of the conventional method for calculating ion distribution and the method for calculating ion distribution according to the present invention becomes more significant. In recent years elements formed on semiconductor devices have become minuter, so the influence of this difference will become more significant. Therefore, the usefulness of the method for calculating ion distribution according to the present invention will increase.

In the above embodiment, a case where dose is equally divided into nths to perform ion implantation n times has been described. However, dose may be divided arbitrarily to do calculations.

Now, such a method will be described.

It is assumed that ion implantation is performed with a dose of $\Phi_2$ after ion implantation being performed with a dose of $\Phi_1$. Then the resultant ion distribution is given by:

ti $N_1(x)=(\Phi_1-\Phi_{chan}(\Phi_1))n_a(x)+\Phi_{chan}(\Phi_1)n_c(x)$ $N_2(x)=((\Phi_1+\Phi_2)-\Phi_{chan}(\Phi_1+\Phi_2))n_a(x)+\Phi_{chan}$ $$(\Phi_{1+\Phi_2})n_c(x) \quad (8)$$

Ion distribution after the second ion implantation is given by $$\Delta N_2(x) = N_2(x) - N_1(x) \quad (9)$$
$$= [\Phi_2 - (\Phi_{chan}(\Phi_1 + \Phi_2) - \Phi_{chan}(\Phi_1))]n_a(x) +$$
$$[\Phi_{chan}(\Phi_1 + \Phi_2) - \Phi_{chan}(\Phi_1)]n_c(x)$$

Calculations should be done in the same way that has been described above by the use of the above formulas. By doing so, results can be obtained even if dose is divided arbitrarily.

Moreover, in the above embodiment the description has been given with a case where one kind of ions are implanted as an example. However, the present invention is also applicable to a case where more than one kind of ions are implanted. Such a method will now be described.

It is assumed that another kind of ions is implanted with a dose of $\Phi$ after a predetermined kind of ions being implanted with a dose of $\Phi_x$. In this case, ion distribution is given by $$N(x)=(\Phi-\Phi_{chan}(\Phi+\Phi_x)n_a(x)+\Phi_{chan}(\Phi+\Phi_x)\,n_c(x) \quad (10)$$

Therefore, if more than one kind of ions are implanted, the doses of these kinds of ions implanted in a channeling area should be found. By doing so, ion distribution can be calculated in the same way that has been described above.

Furthermore, in the above embodiment ion concentration was expressed only by the depth parameter x. However, if ions are implanted from different directions, ion concentration at the same depth may not be uniform. In that case, ion concentration can be expressed by a parameter (y, for example) indicative of a position on a plane perpendicular to the depth direction.

In such a case, the distribution of ion concentration should be calculated along a path along which ions are implanted.

Finally the above processing functions can be realized with a computer. In that case, a program in which the contents of the functions a unit for executing the method for calculating ion distribution should have are described is provided. By executing this program on a computer, the above functions are realized on the computer. This program can be recorded on a computer readable record medium. A computer readable record medium can be a magnetic recording device, an optical disk, a magneto-optical recording medium, a semiconductor memory, or the like. A magnetic recording device can be a hard disk drive (HDD), a flexible disk (FD), a magnetic tape, or the like. An optical disk can be a digital versatile disc (DVD), a digital versatile disc random access memory (DVD-RAM), a compact disc read only memory (CD-ROM), a compact disc recordable (CD-R)/rewritable (CD-RW), or the like. A magneto-optical recording medium can be a magneto-optical disc (MO) or the like.

To place the program on the market, portable record media, such as DVDs or CD-ROMs, on which it is recorded are sold. Alternatively, the program is stored in advance on a hard disk in a server computer and is transferred to another computer via a network.

When a computer executes this program, it will store the program, which is recorded on a portable record medium or which is transferred from a server computer, on, for example, its hard disk. Then it reads the program from its hard disk and performs processes in compliance with the program. A computer can also read the program directly from a portable record medium and perform processes in compliance with the program. Furthermore, each time the program is transferred from a server computer, a computer can perform processes in turn in compliance with the program it received.

As has been described in the foregoing, in the present invention existing ion distribution is specified, ion distribution created by the next ion implantation is assumed, the differential between the existing ion distribution and the ion distribution created by the next ion implantation is calculated, and ion distribution is calculated according to dose calculated on the basis of the differential. Therefore, an error which occurs in a channeling area can be reduced.

Furthermore, as has been described in the foregoing, in the present invention a computer is made to specify existing ion distribution, to assume ion distribution created by the next ion implantation, to calculate the differential between the existing ion distribution and the ion distribution created by the next ion implantation, and to calculate ion distribution according to dose calculated on the basis of the differential. Therefore, an error which occurs in a channeling area in the case of calculating ion distribution can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for calculating ion distribution in a crystalline member in the case of implanting ions in the member more than one time, the method comprising:
   a step of inputting conditions of ion implantation via an input device;
   an ion distribution specification step for obtaining existing ion distribution data by adding ion distribution in an amorphous area and ion distribution in a channeling area, the existing ion distribution data representing existing ion distribution which has been created by performing ion implantation n (n is a natural number) times;
   an ion distribution assumption step for obtaining assumed ion distribution data by adding ion distribution in the amorphous area and ion distribution in the channeling area, the assumed ion distribution data representing assumed ion distribution which will be created by an (n+1)th ion implantation;
   a differential calculation step for calculating differential between the assumed ion distribution, which will be created by the (n+1)th ion implantation and which is assumed by the ion distribution assumption step, and the existing ion distribution specified by the ion distribution specification step;
   an ion distribution calculation step for calculating ion distribution created by the (n+1)th ion implantation by calculating the dose of ions implanted by the (n+1)th ion implantation from the differential calculated by the differential calculation step;
   a step for storing on a hard disk drive data resulted from the calculation of the ion distribution created by the (n+1)th ion implantation; and
   a step for converting the data into a video signal and outputting the video signal to a display device.

2. The method for calculating ion distribution according to claim 1, wherein the dose obtained by equally dividing entire dose into Nths (N≧n) is used each time the ion implantation is performed.

3. The method for calculating ion distribution according to claim 1, wherein the dose obtained by arbitrarily dividing entire dose is used each time the ion implantation is performed.

4. The method for calculating ion distribution according to claim 2, wherein more than one kind of ions are implanted in the ion implantation.

5. The method for calculating ion distribution according to claim 3, wherein more than one kind of ions are implanted in the ion implantation.

6. The method for calculating ion distribution according to claim 1, wherein:
   the ion distribution specification step specifies existing ion distribution along an implantation path; and
   the ion distribution calculation step calculates ion distribution created by the (n+1)th ion implantation along the implantation path.

7. The method for calculating ion distribution according to claim 1, wherein the ion distribution is ion distribution in an amorphous area and ion distribution in a channeling area.

8. The method for calculating ion distribution according to claim 1, wherein the crystalline member is a semiconductor substrate.

9. A computer readable program for making a computer calculate ion distribution in a crystalline member in the case of implanting ions in the member more than one time, the program making the computer function as:
   a step of inputting conditions of ion implantation via an input device;
   an ion distribution specification step for obtaining existing ion distribution data by adding ion distribution in an amorphous area and ion distribution in a channeling area, the existing ion distribution data representing existing ion distribution which has been created by performing ion implantation n (n is a natural number) times;
   an ion distribution assumption step for obtaining assumed ion distribution data by adding ion distribution in the amorphous area and ion distribution in the channeling area, the assumed ion distribution data representing assumed ion distribution which will be created by an (n+1)th ion implantation;
   a differential calculation step for calculating the differential between the assumed ion distribution, which will be created by the (n+1)th ion implantation and which is assumed by the ion distribution assumption step, and the existing ion distribution specified by the ion distribution specification step;
   an ion distribution calculation step for calculating ion distribution created by the (n+1)th ion implantation by calculating the dose of ions implanted by the (n+1)th ion implantation from the differential calculated by the differential calculation step;
   a step for storing on a hard disk drive data resulted from the calculation of the ion distribution created by the (n+1)th ion implantation; and
   a step for converting the data into a video signal and outputting the video signal to a display device.

* * * * *

UNITED STATES PATENT AND TRADEMARK OFFICE
CERTIFICATE OF CORRECTION

PATENT NO. : 7,149,667 B2  
APPLICATION NO. : 10/400619  
DATED : December 12, 2006  
INVENTOR(S) : Kunihiro Suzuki Page 1 of 1

It is certified that error appears in the above-identified patent and that said Letters Patent is hereby corrected as shown below:

Column 9, line 54, after "for calculating" insert --the--.

Signed and Sealed this

Third Day of April, 2007

JON W. DUDAS  
*Director of the United States Patent and Trademark Office*